United States Patent
Francese et al.

(10) Patent No.: US 10,397,027 B2
(45) Date of Patent: Aug. 27, 2019

(54) CONTINUOUS TIME LINEAR EQUALIZER

(71) Applicant: International Business Machines Corporation, Armonk, NY (US)

(72) Inventors: Pier Andrea Francese, Adliswil (CH); Ilter Oezkaya, Adliswil (CH); Alessandro Cevrero, Oberrieden (CH)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 15/715,205

(22) Filed: Sep. 26, 2017

(65) Prior Publication Data

US 2019/0097845 A1     Mar. 28, 2019

(51) Int. Cl.
| | |
|---|---|
| *H03F 3/34* | (2006.01) |
| *H03F 3/45* | (2006.01) |
| *H03F 3/193* | (2006.01) |
| *H04L 25/03* | (2006.01) |
| *H04B 1/10* | (2006.01) |

(52) U.S. Cl.
CPC ....... *H04L 25/03038* (2013.01); *H03F 3/193* (2013.01); *H03F 3/34* (2013.01); *H03F 3/45246* (2013.01); *H04L 25/03159* (2013.01); *H04L 25/03885* (2013.01);
(Continued)

(58) Field of Classification Search
CPC .......... H03F 3/181; H03F 3/185; H03F 3/189; H03F 3/193; H03F 3/20; H03F 3/3055; H03F 3/34; H03F 3/45; H03F 3/45246; H03F 2203/45022; H03F 2203/45028; H04B 1/1081; H04L 25/03038;
(Continued)

(56) References Cited

U.S. PATENT DOCUMENTS

| | | | | | |
|---|---|---|---|---|---|
| 6,092,412 | A | * | 7/2000 | Flechsig | ................. G11B 5/82 |
| | | | | | 73/105 |
| 6,819,166 | B1 | * | 11/2004 | Choi | ................. H04L 25/03885 |
| | | | | | 327/551 |

(Continued)

FOREIGN PATENT DOCUMENTS

EP     1328050 B1     3/2011

OTHER PUBLICATIONS

Gondi et al., "Equalization and Clock and Data Recovery Techniques for 10-Gb/s CMOS Serial-Link Receivers," IEEE Journal of Solid-State Circuits, Sep. 2007, pp. 1999-2011.

(Continued)

*Primary Examiner* — Young T Tse
(74) *Attorney, Agent, or Firm* — Jared C. Chaney

(57) ABSTRACT

The present invention relates to a continuous time linear equalizer comprising a first signal path comprising a high pass filter and a first controllable transconductance unit and a second signal path comprising a second controllable transconductance unit. The continuous time linear equalizer comprises a summation node configured to receive complementary current summation signals of the first transconductance unit and the second transconductance unit. The high pass filter comprises a first port configured to receive an input signal, a second port coupled to a control port of the first transconductance unit and a third port coupled to the summation node. The invention is notably also directed to a corresponding method and a corresponding design structure.

17 Claims, 7 Drawing Sheets

(52) U.S. Cl.
CPC .............. *H03F 2203/45022* (2013.01); *H03F 2203/45028* (2013.01); *H04B 1/1081* (2013.01); *H04L 2025/03541* (2013.01)

(58) Field of Classification Search
CPC ......... H04L 25/03159; H04L 25/03885; H04L 2025/03541
USPC ..... 375/232, 233, 346, 349, 350; 455/251.1, 455/253.1, 253.2, 338, 339, 340, 341
See application file for complete search history.

(56) References Cited

U.S. PATENT DOCUMENTS

| | | | |
|---|---|---|---|
| 8,274,326 B2* | 9/2012 | Boecker | H03F 1/301 327/559 |
| 8,810,319 B1 | 8/2014 | Chan et al. | |
| 9,288,085 B2 | 3/2016 | Bulzacchelli et al. | |
| 9,741,245 B1* | 8/2017 | Fischer | H02N 2/0075 |
| 2002/0140458 A1* | 10/2002 | Sato | H03K 19/01707 326/108 |
| 2003/0024759 A1* | 2/2003 | Williams | B62D 5/0463 180/443 |
| 2016/0087817 A1 | 3/2016 | Huang et al. | |
| 2016/0173299 A1* | 6/2016 | Islam | H04L 25/03057 375/233 |
| 2018/0026816 A1* | 1/2018 | Pickerd | H04B 15/00 |

OTHER PUBLICATIONS

Lu et al., "A 66Gb/s 46mW 3-tap decision-feedback equalizer in 65nm CMOS,"IIEEE International Solid-State Circuits Conference—(ISSCC), pp. 30-32, Feb. 2013. http://ieeexplore.ieee.org/stamp/stamp.jsp?tp=&arnumber=6487623.

Beyene, "The design of continuous-time linear equalizers using model order reduction techniques", 2008 IEEE-EPEP Electrical Performance of Electronic Packaging, 6 pages http://ieeexplore.ieee.org/stamp/stamp.jsp?tp=&arnumber=4675910.

Parikh et al., "A 32Gb/s wireline receiver with a low-frequency equalizer, CTLE and 2-tap DFE in 28nm CMOS," IEEE International Solid-State Circuits Conference—(ISSCC), pp. 28-29, Feb. 2013. http://ieeexplore.ieee.org/stamp/stamp.jsp?tp=&arnumber=6487622.

Francese et al., "Continuous-time linear equalization with programmable active-peaking transistor arrays in a 14nm FinFET 2mW/Gb/s 16Gb/s 2-Tap speculative DFE receiver," IEEE International Solid-State Circuits Conference—(ISSCC), pp. 186-188, Feb. 2015. http://ieeexplore.ieee.org/stamp/stamp.jsp?tp=&arnumber=7062988.

* cited by examiner

CONTINUOUS TIME LINEAR EQUALIZER

BACKGROUND

The present invention relates to the field of equalization in high-speed receiving units, particularly to a continuous-time linear equalization. Furthermore, the present invention relates to a structure and method a continuous-time linear equalizer suitable for the implementation in integrated circuitry, particularly in Complementary Metal-Oxide Semiconductor (CMOS) technology.

Data transceiving systems for high-speed communication are subject to signal attenuation and distortion of the transmitted signal. Various measures are applied to reconstruct the transmitted data from the received analog signal. In receiving units, a number of equalizers are commonly provided to compensate for losses and signal distortion substantially caused by propagating the data signal via the transmission channel.

Continuous time linear equalizers (CTLE) are used in the receiving units in order to equalize the transmission channel attenuation up to a peaking frequency by means of a high-pass transfer function, which counterbalances the low-pass characteristic of the transmission channel.

The CTLE typically operates on both data- and clock-paths. Therefore, the signal integrity at both the maximum amplitude (a.k.a. eye center) and at the zero crossings of the received signal should be equalized.

SUMMARY

According to an aspect, in an embodiment, the present invention provides structure comprising a high pass filter and a first controllable transconductance unit and a second signal path comprising a second controllable transconductance unit. The continuous-time linear equalizer comprises a summation node configured to receive complementary current summation signals of the first transconductance unit and the second transconductance unit. The high pass filter comprises a first port configured to receive an input signal, a second port coupled to a control port of the first transconductance unit and a third port coupled to the summation node.

According to an embodiment, the invention is embodied as a method for operating a continuous time linear equalizer. The continuous time linear equalizer comprises a first signal path comprising a high pass filter and a first controllable transconductance unit and a second signal path comprising a second controllable transconductance unit. The equalizer further comprises a summation node configured to receive complementary current summation signals of the first transconductance unit and the second transconductance unit. The high pass filter is a first order high pass filter comprising a resistor and a capacitor. The resistor and/or the capacitor are adjustable. The high-pass filter comprises a first port configured to receive an input signal, a second port coupled to a control port of the first transconductance unit and a third port coupled to the summation node.

In an embodiment, the method comprises a step of controlling a transfer function of the equalizer by adjusting the capacitance of the capacitor and/or by adjusting the resistance of the resistor.

According to yet another aspect, the invention can be embodied as a method for designing, manufacturing, or testing an integrated circuit. The design structure comprises a continuous time linear equalizer according to the first aspect.

Devices and methods embodying the present invention will now be described, by way of non-limiting examples, and in reference to the accompanying drawings. Technical features depicted in the drawings are not necessarily to scale. Also some parts may be depicted as being not in contact to ease the understanding of the drawings, whereas they may very well be meant to be in contact, in operation.

DETAILED DESCRIPTION

Figure 1:
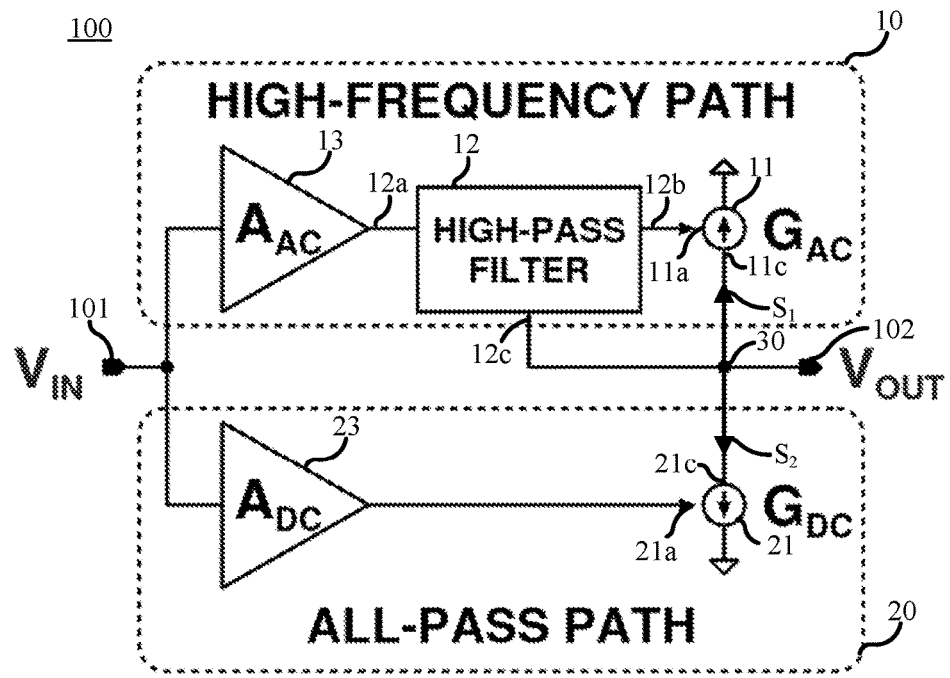
FIG. 1 shows a schematic block diagram of a continuous-time linear equalizer according to an embodiment of the invention.

FIG. 1 shows a schematic block diagram of a continuous time linear equalizer 100 according to an embodiment of the invention. The continuous time linear equalizer 100 comprises a first signal path 10 comprising a high pass filter 12, a first controllable transconductance unit 11 and an amplifier 13. The high pass filter 12 comprises a first port 12a which is connected to an output of the amplifier 13 and which is configured to receive an output signal of the amplifier 13 as input signal. The high pass filter 12 further comprises a second port 12b which is connected to a control port 11a of the first transconductance unit 11 and a third port 12c which is connected to a summation node 30.

The equalizer 100 further comprises a second signal path 20 comprising a serial arrangement of an amplifier 23 and a second controllable transconductance unit 21 with a control port 21a.

The summation node 30 is connected to an output port 11c of the first transconductance unit 11 and to an output port 21c of the second transconductance unit 21. The summation node 30 is configured to receive a current summation signal $S_1$ from the first transconductance unit 11 and a summation signal $S_2$ from the second transconductance unit 21.

The equalizer 100 comprises an input port 101 which is configured to receive an input voltage $V_{IN}$ and an output port 102 which is configured to provide an output voltage $V_{OUT}$.

The input voltage $V_{in}$ is supplied in parallel to the first signal path 10 and the second signal path 20.

The first signal path 10 is configured as high frequency signal path and accordingly operates on high frequency signal components of the input voltage $V_{IN}$.

The second signal path 20 is configured as low frequency signal path and accordingly operates on low frequency and DC signal components of the input voltage $V_{IN}$. Alternatively the second signal path 20 may also be configured as all pass signal path (all pass path) that operates on the whole spectrum of the input voltage $V_{IN}$. High frequency signal components may be understood as signal components that have a higher frequency than the low frequency signal components processed by the second signal path 20.

Accordingly, the amplifier 13 is embodied as high frequency amplifier and is also denoted with $A_{AC}$. Furthermore, the amplifier 23 is embodied as low frequency or DC amplifier and is also denoted as $A_{DC}$.

The first transconductance unit 11 has a controllable transconductance $G_{AC}$ and is hence also denoted as $G_{AC}$. The first transconductance unit 11 and the second transconductance unit 21 form an inverter with a high frequency characteristic. More particularly, the first transconductance unit 11 and the second transconductance unit 21 perform a complementary current summation and thereby combine the low-frequency signal components of the second path 20 and the high-frequency signal components of the first path 10 in a feedforward manner.

Such a complementary current summation is a very efficient topology to combine a DC or an all-pass path with an AC (high-frequency) path.

The connection between the third port 12c of the high pass filter 12 and the summation node 30 establishes a feedback loop around the first transconductance unit 11. With such a feedback loop the bias for the first transconductance unit 11 can be implemented in an efficient and simple way. This is in particular very power efficient. Furthermore, such an arrangement may double the effective capacitance of the high pass filter 12 as will be explained in more detail below.

The separation in the first signal path 10 (high frequency/AC path) and the second signal path 20 (low frequency/DC path) provides the advantage that the DC gain can be decoupled from the peaking control. More particularly, the peaking boost may be controlled by adjusting the AC coupled feed-forward path zero/pole position and separation without affecting the DC path characteristic. This will be illustrated in the following with reference to FIG. 2.

Figure 2:
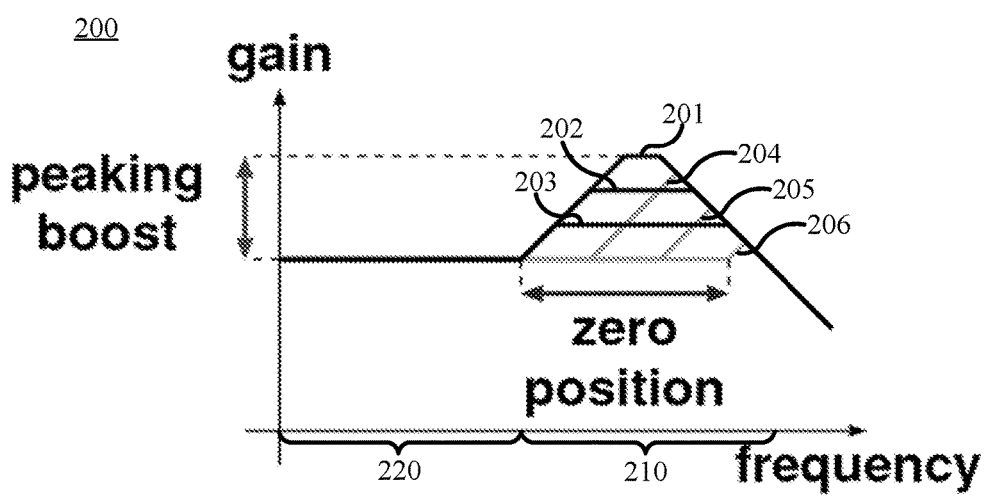
FIG. 2 illustrates in a simplified and schematic way a gain-frequency diagram of equalizers according to embodiments of the invention.

FIG. 2 illustrates in a simplified and schematic way a gain-frequency diagram 200 of equalizers according to embodiments of the invention. The horizontal x-axis denotes the frequency and the vertical y-axis the gain of the equalizer.

The gain-frequency diagram 200 comprises a high frequency spectral part 210 and a low frequency or DC spectral part 220. The first signal path 10 of the equalizer 100 of FIG. 1 only operates on the high frequency spectral part 210, while the second signal path 20 of the equalizer 100 of FIG. 1 operates at least on the low frequency spectral part 220, but it may operate also on both the high frequency spectral part 210 and the low frequency spectral part 220.

The horizontal lines 201, 202 and 203 show different gains in the high frequency signal spectrum 210 which can be adjusted by adjusting one or more components of the high pass filter 12 and by thereby adjusting the peaking boost. The DC and low frequency gain in the low frequency spectrum 220 remains unaffected by the different peaking boosts.

The skewed and dashed lines 204, 205 and 206 indicate gain-frequency diagrams for different zero positions of the transfer function of the equalizer which can also be adjusted by adjusting one or more components of the high pass filter 12 as will be explained below in more detail.

Figure 3:
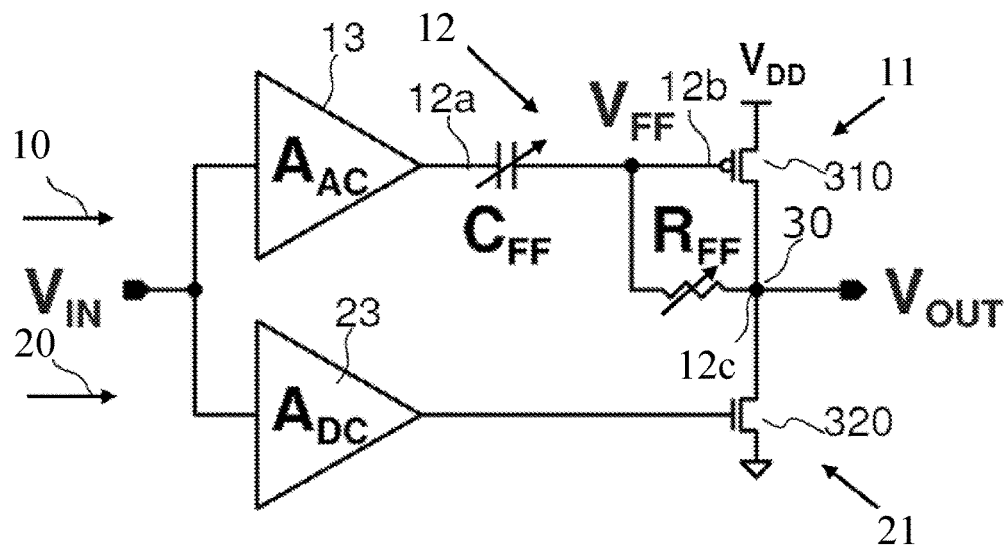
FIG. 3 shows a schematic circuit diagram of a continuous time linear equalizer having a p-FET in a first (AC) signal path and a N-FET in a second (DC) signal path.

FIG. 3 shows a schematic circuit diagram of a continuous time linear equalizer 300 according to an embodiment of the invention. The equalizer 300 is a more detailed implementation of the equalizer 100 of FIG. 1. Accordingly, for the same or similar parts the same reference numerals as in FIG. 1 are used. The continuous time linear equalizer 300 comprises a first signal path 10 comprising a high pass filter 12, a first controllable transconductance unit 11 and an amplifier 13. The high pass filter 12 is embodied as a first order high pass filter comprising a resistor $R_{FF}$ and a capacitor $C_{FF}$. The capacitor $C_{FF}$ is coupled between the first port 12a and the second port 12b of the high pass filter 12. The resistor $R_{FF}$ is coupled between the second port 12b and the third port 12c of the high pass filter 12. The first transconductance unit 11 is embodied as p-type field effect transistor 310 and the second transconductance unit 21 is embodied as n-type field effect transistor 320. The gate of the p-type field effect transistor 310 is coupled to the second port 12b of the high-pass filter 12. The source of the p-type field effect transistor 310 is coupled to a supply voltage $V_{DD}$. The drain of the p-type field effect transistor 310 is coupled to the summation node 30. Furthermore, the gate of the n-type field effect transistor 320 is coupled to the second signal path 20 and more particularly to the output of the amplifier 23. The drain of the n-type field effect transistor 320 is coupled to the summation node 30 and the source of the p-type field effect transistor 320 is coupled to ground. The resistor $R_{FF}$ provides a bias signal to the gate of the p-type field effect transistor 310. The high-pass filter 12 forwards a feedforward voltage $V_{FF}$ as control voltage to the gate of the p-type field effect transistor 310.

The resistor $R_{FF}$ and the capacitor $C_{FF}$ may be both adjustable. Hence the equalizer 300 may provide a desired transfer function by tuning/adjusting the resistance of the resistor $R_{FF}$ and/or the capacitance of the capacitor $C_{FF}$ respectively.

Figure 4:
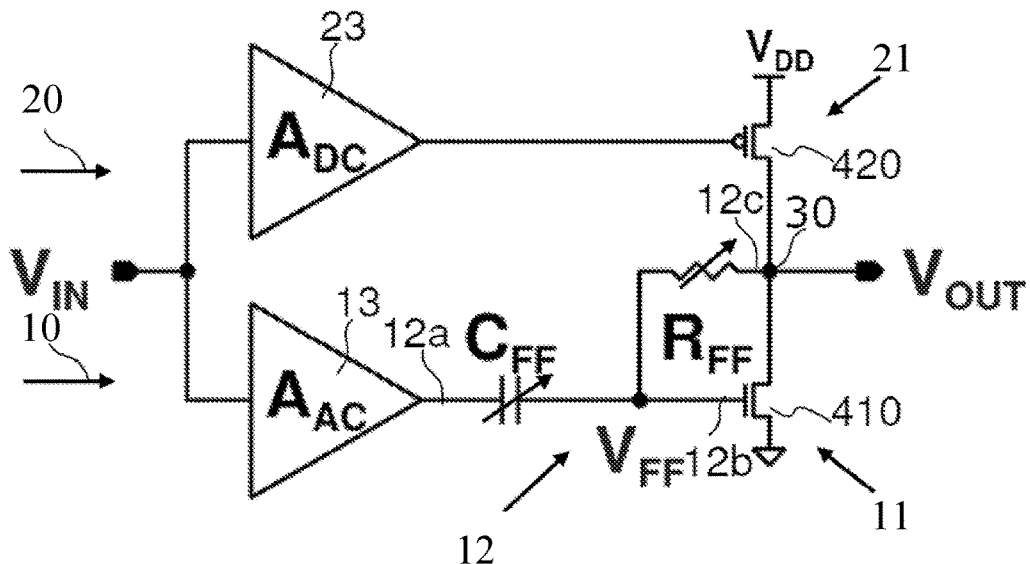
FIG. 4 shows a schematic block diagram of a continuous time linear having a n-FET in the AC signal path and a p-FET in the DC signal path.

FIG. 4 shows a schematic circuit diagram of a continuous time linear equalizer 400 according to an embodiment of the invention. The continuous time linear equalizer 400 comprises a first signal path 10 comprising a high pass filter 12, a first controllable transconductance unit 11 and an amplifier 13. The high pass filter 12 is embodied as a first order high pass filter comprising a resistor $R_{FF}$ and a capacitor $C_{FF}$. The capacitor $C_{FF}$ is coupled between the first port 12a and the second port 12b of the high pass filter 12. The resistor $R_{FF}$ is coupled between the second port 12b and the third port 12c of the high pass filter 12. The first transconductance unit 11 is embodied as n-type field effect transistor 410 and the second transconductance unit 21 is embodied as p-type field effect transistor 420. The gate of the p-type field effect transistor 420 is coupled to an input of the second signal path 20 and more particularly to the output of the amplifier 23. The source of the p-type field effect transistor 420 is coupled to a supply voltage $V_{DD}$ and the drain of the p-type field effect transistor 420 is coupled to the summation node 30. The gate of the n-type field effect transistor 410 is coupled to the second port 12b of the high-pass filter 12. The drain of the n-type field effect transistor 420 is coupled to the summation node 30 and the source of the n-type field effect transistor 420 is coupled to ground. The resistor $R_{FF}$ provides a bias signal to the gate of the n-type field effect transistor 410. The high pass filter 12 forwards a feedforward voltage $V_{FF}$ as control voltage to the gate of the n-type field effect transistor 410.

The resistor $R_{FF}$ and the capacitor $C_{FF}$ may be both adjustable. Hence the equalizer 400 may provide a desired transfer function by tuning/adjusting the resistance of the resistor $R_{FF}$ and/or the capacitance of the capacitor $C_{FF}$ respectively.

Figure 5:
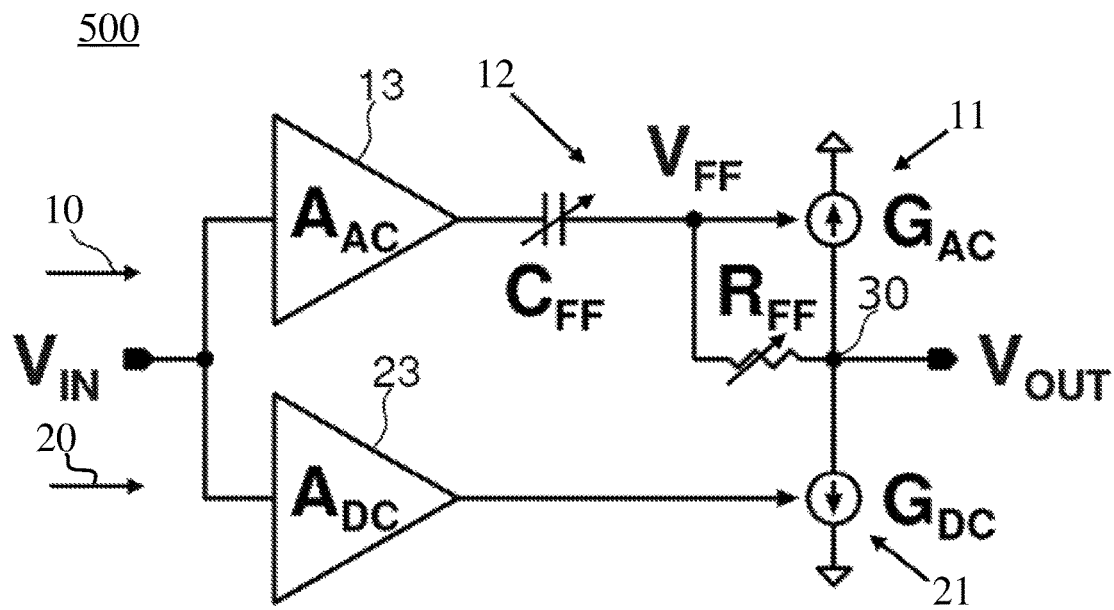
FIG. 5 shows a schematic circuit diagram of a continuous time linear equalizer corresponding to FIG. 3.

FIG. 5 shows a schematic circuit diagram of a continuous time linear equalizer 500 according to an embodiment of the invention. The equalizer 500 corresponds to the equalizer 300 of FIG. 3, but the p-type field effect transistor 310 has been replaced by the more general representation of a first transconductance unit $G_{AC}$ and the n-type field effect transistor 320 has been replaced by the more general representation of a second transconductance unit $G_{DC}$.

The high-pass transfer characteristic is realized by a zero/pole pair. Both the zero/pole location and separation can be controlled by varying only elements in the first signal path/AC path 10 so that the low-frequency gain is maintained constant. Both the capacitor $C_{FF}$ and the resistor $R_{FF}$ of the high pass filter 12 may be adjustable.

The Laplace transfer function TF(s) in the frequency domain of the equalizer 500 may by expressed by the following formula:

$$TF(s) = -A_{DC} \cdot \frac{G_{DC}}{G_{AC}} \cdot \frac{1 + s \cdot \left[1 + \frac{A_{AC}}{A_{DC}} \cdot \frac{(G_{AC} - G_{FF})}{G_{DC}}\right] \cdot \frac{C_{FF}}{G_{FF}}}{1 + s\frac{C_{FF}}{G_{AC}}},$$ (Equation 1)

wherein $A_{DC}$ is the gain of the DC amplifier 23, $A_{AC}$ is the gain of the AC amplifier 13, $G_{AC}$ is the transconductance of the first transconductance unit $G_{AC}$, $G_{DC}$ is the transconductance of the second transconductance unit $G_{DC}$, $C_{FF}$ the capacitance of the capacitor $C_{FF}$ and $G_{FF}$ the transconductance of the resistor $R_{FF}$. In this respect it should be noted that the terms $A_{DC}$, $A_{AC}$, $G_{AC}$, $G_{DC}$, $C_{FF}$, $G_{FF}$, and $R_{FF}$ are used interchangeably for the respective component as well as for the value of the respective component. As an example, the term $R_{FF}$ may denote the resistor $R_{FF}$ as well as its resistance. Furthermore, s is the complex variable $$s = \sigma + j\omega$$ (Equation 2).

According to embodiments the equalizer 500 is preferably designed in such a way that $$G_{AC} \gg G_{FF} = \frac{1}{R_{FF}}$$ (Equation 3)

$$G_{DC} \simeq G_{AC}.$$

In other words, the transconductance $G_{AC}$ of the controllable first transconductance unit 11 is considerably greater than the transconductance $G_{FF}$ of the resistor $R_{FF}$ of the high pass filter 12. Considerably greater means greater by a factor 10 or more. Furthermore, the transconductance of the controllable first transconductance unit 11 is approximately equal to the transconductance $G_{AC}$ of the second transconductance unit 21. According to embodiments approximately equal shall mean equal within a range of 25% or less. With such an assumption the transfer function TF(s) can be described approximately as follows:

$$TF(s) \simeq -A_{DC} \cdot \frac{1 + s \cdot \left(1 + \frac{A_{AC}}{A_{DC}}\right) \cdot \frac{C_{FF}}{G_{FF}}}{1 + s\frac{C_{FF}}{G_{AC}}}.$$ (Equation 4)

Hence by adjusting the capacitance of the adjustable capacitor $C_{FF}$ and/or the resistance of the adjustable resistor $R_{FF}$, the transfer function TF(s) can be adjusted and tuned in a desired way.

Figure 6:
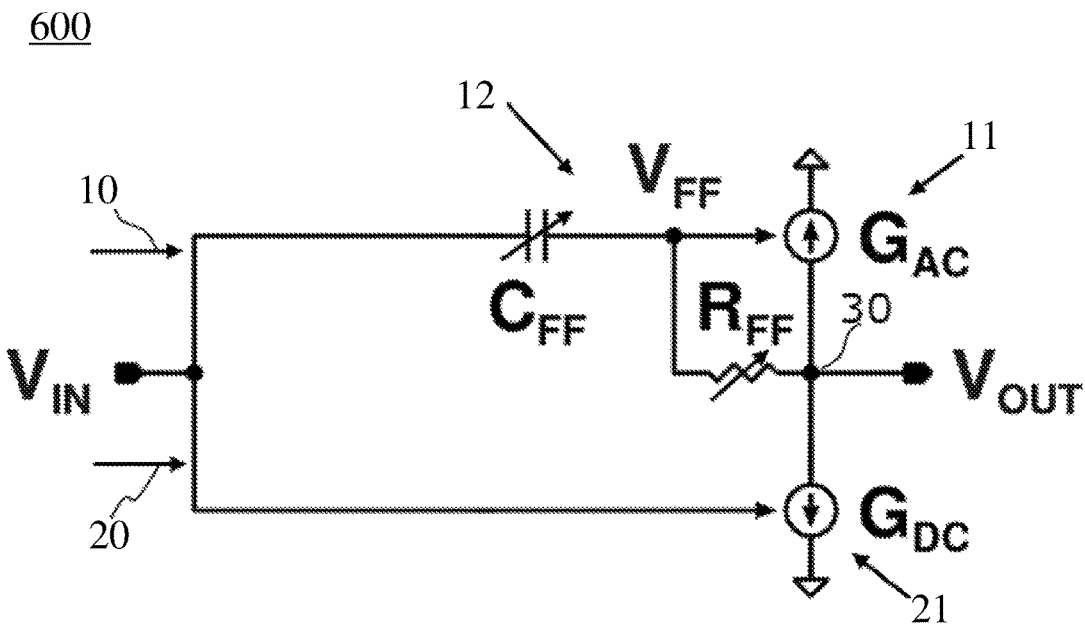
FIG. 6 shows a schematic circuit diagram of a continuous time linear equalizer corresponding to FIG. 4.

FIG. 6 shows a schematic circuit diagram of a continuous time linear equalizer 600 according to another embodiment of the invention. According to this embodiment, the first signal path 10 and the second signal path 20 of the equalizer 600 do not comprise any amplifier. Rather the input voltage $V_{IN}$ is on the one hand directly connected to the high pass filter 12 and on the other hand directly connected to the second transconductance unit 21.

This results in a simplified transfer function TF(s) of the equalizer 600 in the frequency domain given by the following formula:

$$TF(s) = -\frac{G_{DC}}{G_{AC}} \cdot \frac{1 + s \cdot \left(1 + \frac{G_{AC} - G_{FF}}{G_{DC}}\right) \cdot \frac{C_{FF}}{G_{FF}}}{1 + s\frac{C_{FF}}{G_{AC}}}$$ (Equation 5)

According to embodiments the equalizer 600 is preferably designed in such a way that $$G_{AC} \gg G_{FF} = \frac{1}{R_{FF}}$$ (Equation 6)

$$G_{DC} \simeq G_{AC}.$$

In other words, the transconductance $G_{AC}$ of the controllable first transconductance unit 11 of the equalizer 600 is considerably greater than the transconductance $G_{FF}$ of the resistor $R_{FF}$ of the high pass filter 12. Furthermore, the transconductance of the controllable first transconductance unit 11 is approximately equal the transconductance $G_{DC}$ of the second transconductance unit 21. With such assumption the transfer function TF(s) of the equalizer 600 can be described approximately as follows:

$$TF(s) \simeq -\frac{1 + s \cdot 2 \cdot \frac{C_{FF}}{G_{FF}}}{1 + s\frac{C_{FF}}{G_{AC}}}.$$ (Equation 7)

Hence by adjusting the capacitance of the adjustable capacitor $C_{FF}$ and/or the resistance of the adjustable resistor $R_{FF}$, the transfer function TF(s) can be adjusted and tuned in a desired way.

More particularly, by adjusting the capacitance of the adjustable capacitor $C_{FF}$, the pole and the zero of the transfer function TF(s) can be both adjusted in the same way or more particularly by the same amount. Furthermore, by adjusting the resistance of the adjustable resistor $R_{FF}$, only the zero of the transfer function TF(s) can be adjusted.

As can be seen in the above formula, due to the feedback loop provided by the coupling of the resistor $R_{FF}$ between the third port of the high pass filter 12 and the summation node 30, the effective capacitance of the equalizer 600 has been doubled compared with a circuit that does not comprise such a coupling between the third port of the high pass filter 12 and the summation node (see term 2 $C_{FF}$ in the numerator of the above formula).

Figure 7:
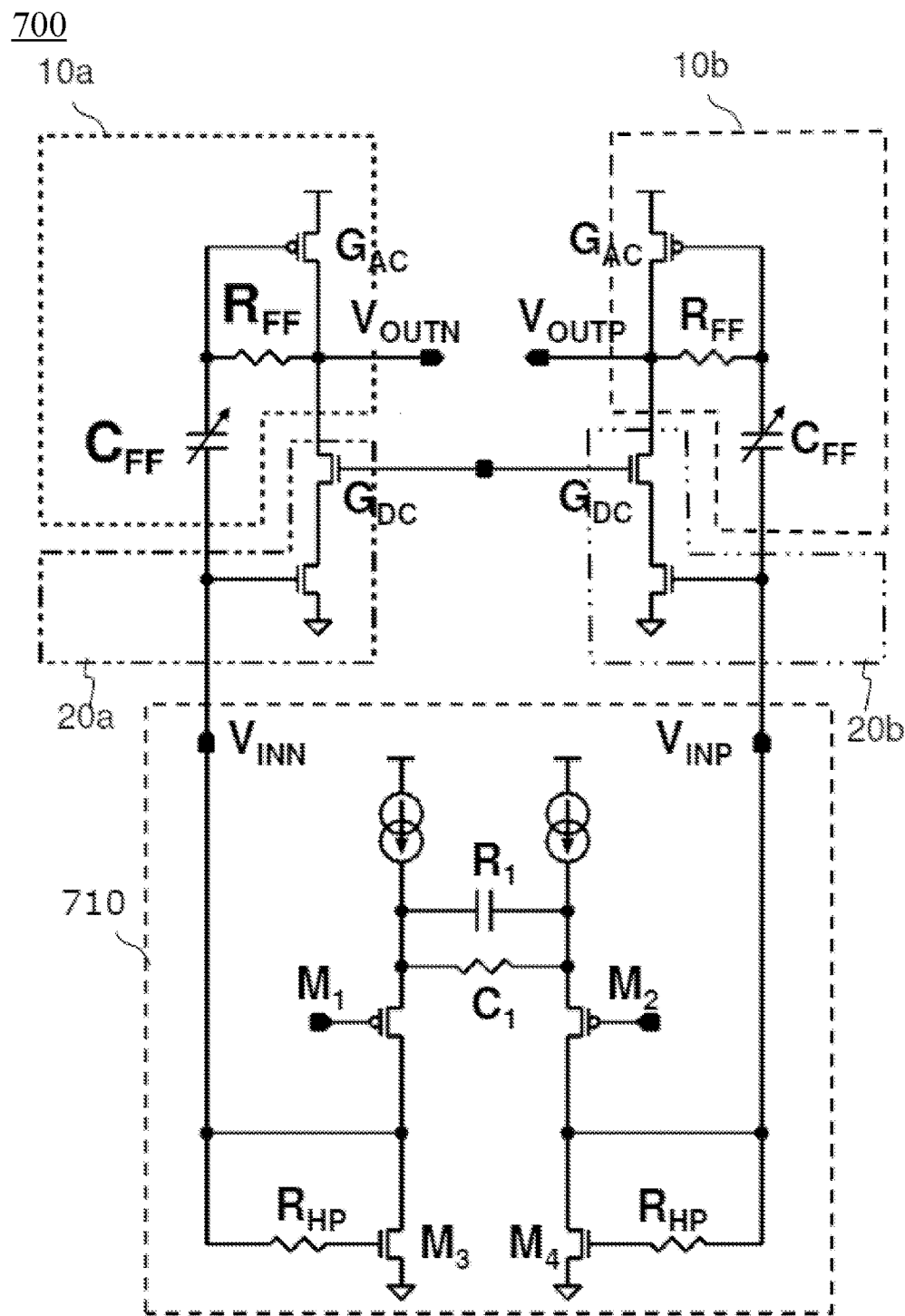
FIG. 7 shows a schematic circuit diagram of a continuous time linear equalizer comprising a common amplifier for the AC signal path and the DC signal path.

FIG. 7 shows a schematic circuit diagram of a continuous time linear equalizer 700 according to an embodiment of the invention. The equalizer 700 is configured as differential equalizer.

Accordingly, the equalizer 700 comprises two first signal paths 10a, 10b and two second signal paths 20a, 20b. The first signal paths 10a, 10b and the second signal paths 20a, 20b are driven by a common differential amplifier 710. The common differential amplifier 710 comprises differential pairs of transistors M1, M2 and M3, M4. The common amplifier 710 is configured to add one or more additional zero/pole pairs to the transfer function of the continuous time linear equalizer 700 by means of source degeneration and active peaking. The source degeneration is implemented by a transistor $R_1$ and a capacitor $C_1$ coupled between the sources of the transistors M1, M2. The active peaking is implemented by means of resistors $R_{HP}$ coupled between the gates of the transistors M2, M4 and the inputs of the signal paths 10a, 20a and 10b, 20b respectively.

The signal paths 10a, 20a receive an input voltage $V_{INN}$ and the signal paths 10b, 20b an input voltage $V_{INP}$.

As a result of the equalization, the equalizer 700 provides a differential pair of output voltages $V_{OUTN}$, $V_{OUTP}$.

According to other embodiments, a common amplifier could be also embodied as a CTLE so that there are two CTLEs in cascade.

Figure 10:
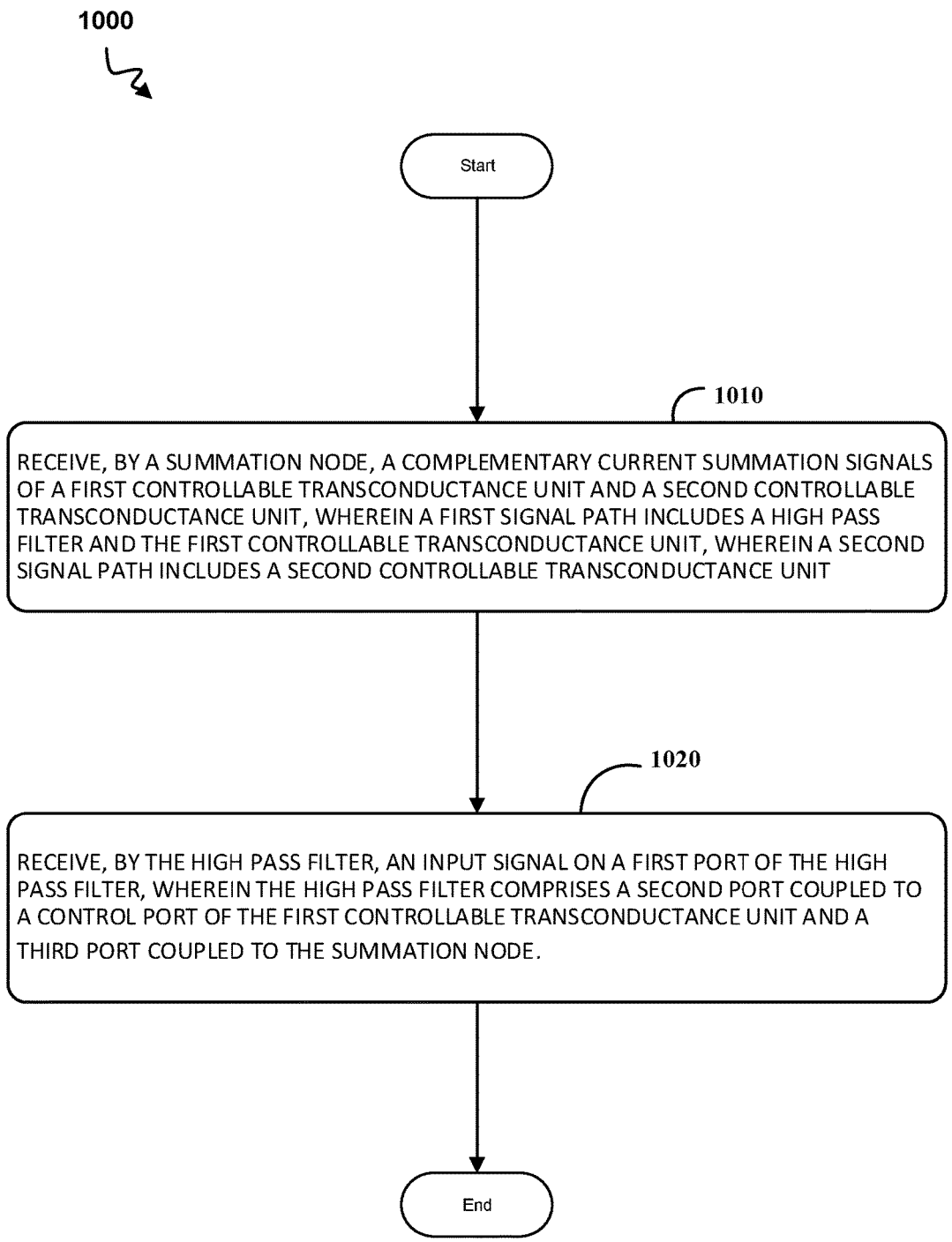
FIG. 10 depicts a flowchart in accordance with an embodiment of the present invention.

Referring to FIG. 10, in an exemplary embodiment, a system is configured to perform a method 1000 is configured to perform an operation 1010 of receiving, by a summation node, a complementary current summation signals of a first controllable transconductance unit and a second controllable transconductance unit, wherein a first signal path includes a high pass filter and the first controllable transconductance unit, wherein a second signal path includes a second controllable transconductance unit, and an operation 1020 of receiving, by the high pass filter, an input signal on a first port of the high pass filter, wherein the high pass filter includes a second port coupled to a control port of the first controllable transconductance unit and a third port coupled to the summation node.

Figure 8:
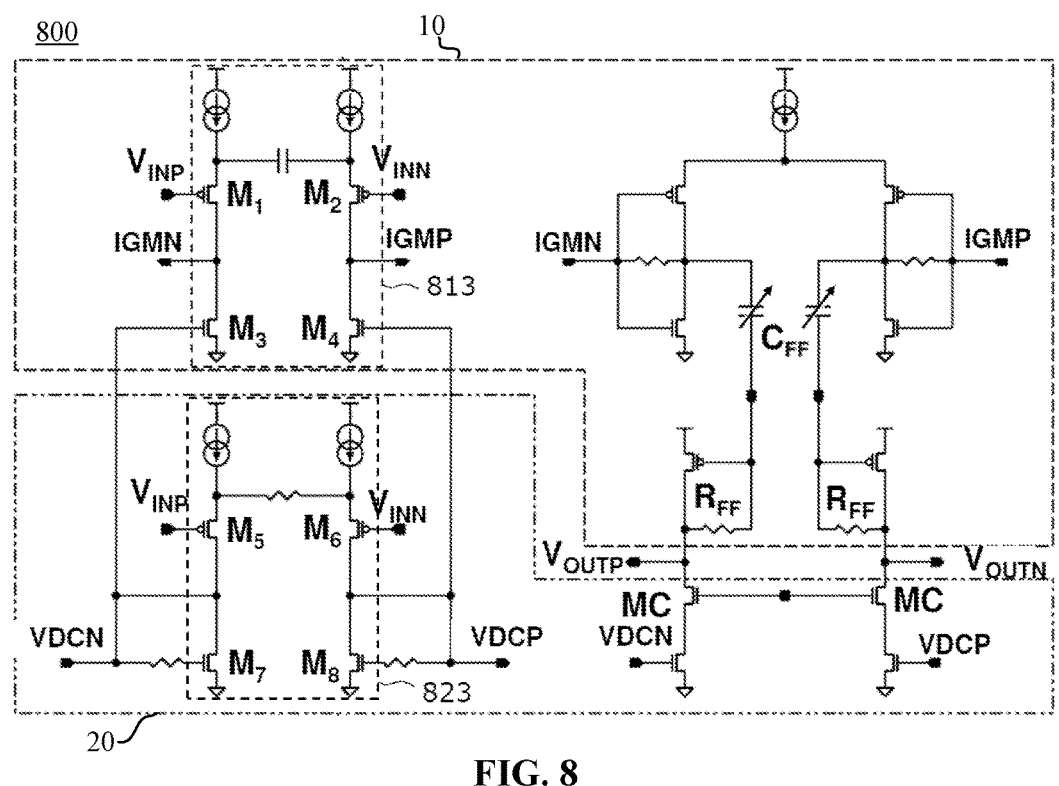
FIG. 8 shows a schematic circuit diagram of a continuous time linear equalizer comprising separate amplifiers in the AC signal path and the DC signal path.

FIG. 8 shows a schematic circuit diagram of a continuous time linear equalizer 800 according to another embodiment of the invention. The equalizer 800 is also configured as differential equalizer.

The equalizer 800 comprises a first signal path 10 and a second signal path 20, each encompassing comprising two differential sub-paths. The first signal path 10 is driven by a separate differential amplifier 813 and the second signal path 20 is driven by a separate differential amplifier 823. The first signal path 10 is embodied as high frequency path and the second signal path 20 is embodied as all pass path. The differential amplifier 813 comprises differential pairs of transistors M1, M2 and M3, M4 and the differential amplifier 823 comprises differential pairs of transistors M5, M6 and M7, M8.

The differential amplifier 813 provides output signals IGMN and IGMP to the further stage of the first signal path 10 and the differential amplifier 823 provides output signals VDCN and VDCP to the further stage of the second signal path 20.

The second signal path 20 comprises a pair of cascode transistors MC with coupled gates. The cascode transistors MC improve the robustness of the design over Process Voltage Temperature (PVT) corners. In case of low voltage design requirement such cascade transistor could be removed.

The first signal path 10 and the second signal path 20 both receive a pair of input voltages $V_{INN}$ and $V_{INP}$.

As a result of the equalization, the equalizer 800 provides a differential pair of output voltages $V_{OUTN}$, $V_{OUTP}$.

Another aspect of the invention relates to a method for operating a continuous time linear equalizer as described above. The method comprises a step of controlling the transfer function of the equalizer by adjusting the capacitance of the adjustable capacitor $C_{FF}$ and/or by adjusting the resistance of the resistor $R_{FF}$.

Figure 9:
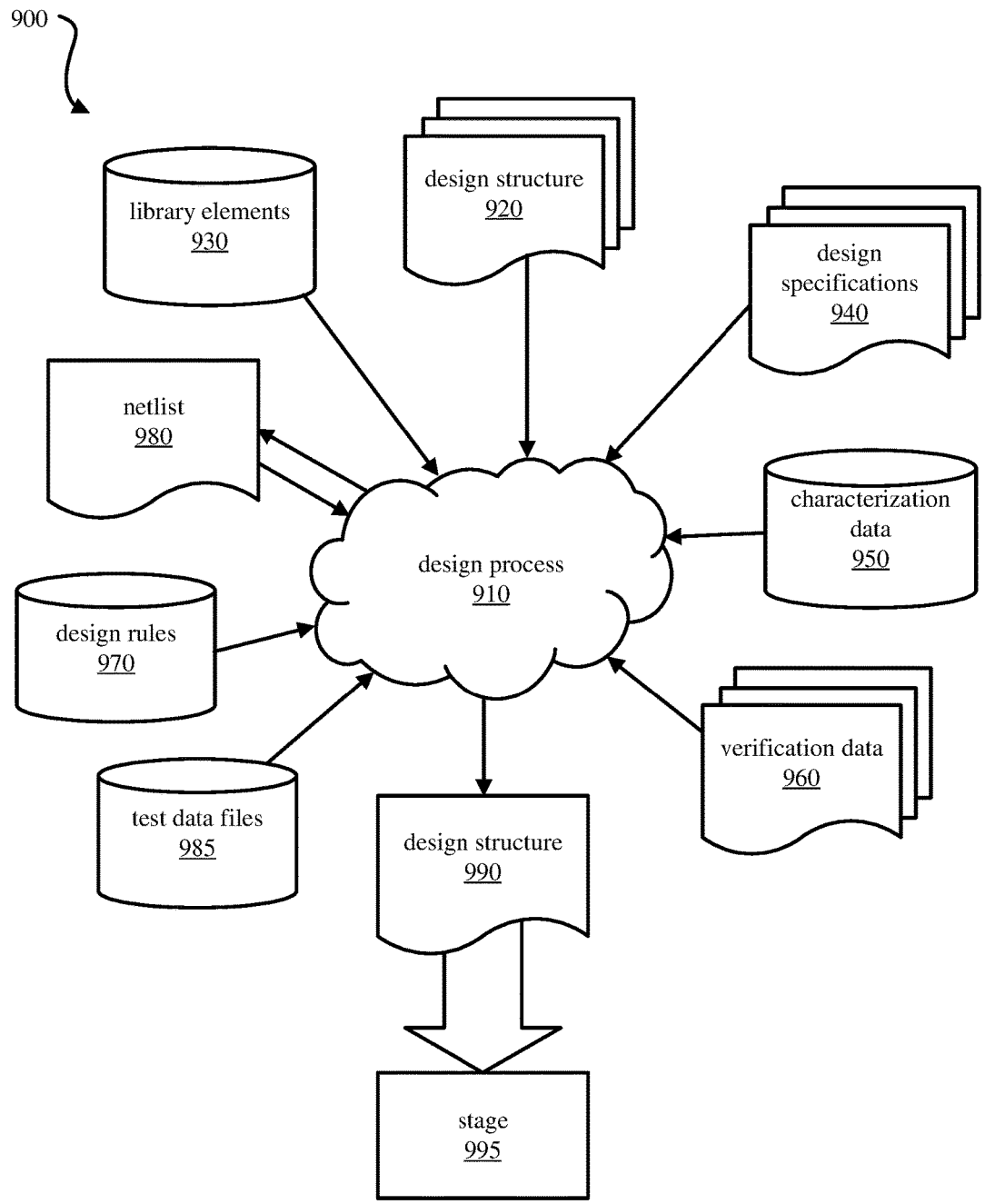
FIG. 9 shows a block diagram of an exemplary design flow used for example, in semiconductor IC logic design, simulation, test, layout, and manufacture.

FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown e.g. in FIGS. 1 to 8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 000 for designing a standard component or from a design flow 900 for instantiating the design into a programmable array.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1 to 8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1 to 8 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 to 8. In one embodiment, design structure 990 may comprise a compiled, executable HDL simulation model that functionally simulates the devices shown in FIGS. 1 to 8.

Design structure 990 may also employ a data format used for the exchange of layout data of integrated circuits and/or symbolic data format (e.g. information stored in any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2 and 3. Design structure 990 may then proceed to a stage 995 where, for example, design structure 990: proceeds to tape-out, is released to manufacturing, is released to a mask house, is sent to another design house, is sent back to the customer, etc.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A system comprising:
   a first signal path comprising a high pass filter and a first controllable transconductance unit;
   a second signal path comprising a second controllable transconductance unit; and
   a summation node configured to receive complementary current summation signals of the first controllable transconductance unit and the second controllable transconductance unit, wherein the high pass filter comprises,
      a first port configured to receive an input signal,
      a second port coupled to a control port of the first controllable transconductance unit, and
      a third port coupled to the summation node.

2. The system of claim 1, wherein the high pass filter is a first order high pass filter comprising a resistor and a capacitor.

3. The system of claim 2, wherein the capacitor is coupled between the first port and the second port of the high pass filter and the resistor is coupled between the second port and the third port of the high pass filter.

4. The system of claim 2, wherein the resistor is configured to provide a bias signal to the control port of the first controllable transconductance unit.

5. The system of claim 2, wherein the resistor is adjustable.

6. The system of claim 5, wherein the system is configured to provide a desired transfer function by adjusting a resistance of the adjustable resistor.

7. The system of claim 2, wherein the capacitor is adjustable.

8. The system of claim 7, wherein the system is configured to provide a desired transfer function by adjusting a capacitance of the adjustable capacitor.

9. The system of claim 1, wherein the second signal path is configured as low frequency path or all pass path.

10. The system of claim 1, wherein the first controllable transconductance unit comprises a p-type field effect transistor and the second controllable transconductance unit comprises an n-type field effect transistor.

11. The system of claim 10, wherein
a gate of the p-type field effect transistor is coupled to the second port of the high pass filter;
a source of the p-type field effect transistor is coupled to a supply voltage;
a drain of the p-type field effect transistor is coupled to the summation node;
a gate of the n-type field effect transistor is coupled to the second signal path;
a drain of the n-type field effect transistor is coupled to the summation node; and
a source of the n-type field effect transistor is coupled to ground.

12. The system of claim 1, wherein the first controllable transconductance unit comprises an n-type field effect transistor and the second controllable transconductance unit comprises a p-type field effect transistor.

13. The system of claim 12, wherein
a gate of the p-type field effect transistor is coupled to the second signal path;
a source of the p-type field effect transistor is coupled to a supply voltage;
a drain of the p-type field effect transistor is coupled to the summation node;
a gate of the n-type field effect transistor is coupled to the second port of the high pass filter;
a drain of the n-type field effect transistor is coupled to the summation node; and
a source of the n-type field effect transistor is coupled to ground.

14. The system of claim 1, wherein the system is configured such that
a transconductance of the first controllable transconductance unit is considerably greater than a transconductance of a resistor of the high pass filter; and
the transconductance of the first controllable transconductance unit is substantially equal to a transconductance of the second controllable transconductance unit.

15. A method comprising:
receiving, by a summation node, complementary current summation signals of a first controllable transconductance unit and a second controllable transconductance unit,
wherein a first signal path comprises a high pass filter and the first controllable transconductance unit; and
wherein a second signal path comprises the second controllable transconductance unit; and
receiving, by the high pass filter, an input signal on a first port of the high pass filter,
wherein the high pass filter comprises a second port coupled to a control port of the first controllable transconductance unit and a third port coupled to the summation node.

16. The method of claim 15, wherein the high pass filter is a first order high pass filter comprising a resistor and a capacitor.

17. A system comprising:
a first signal path comprising a high pass filter and a first controllable transconductance unit;
a second signal path comprising a second controllable transconductance unit; and
a summation node configured to receive complementary current summation signals of the first transconductance unit and the second transconductance unit,
wherein the high pass filter is a first order high pass filter comprising:
a resistor,
a capacitor,
a first port configured to receive an input signal,
a second port coupled to a control port of the first controllable transconductance unit, and
a third port coupled to the summation node,
wherein adjusting at least one of a capacitance of the capacitor or a resistance of the resistor controls a transfer function of the system.

* * * * *